(12) United States Patent
Gao et al.

(10) Patent No.: US 6,383,855 B1
(45) Date of Patent: May 7, 2002

(54) HIGH SPEED, LOW COST BICMOS PROCESS USING PROFILE ENGINEERING

(75) Inventors: Minghui Gao; Haijun Zhao, both of Singapore (SG); Abhijit Bandyopadhyay, Cupertino, CA (US); Pang Dow Foo, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/186,505

(22) Filed: Nov. 4, 1998

(51) Int. Cl.[7] .......................................... H01L 21/8238
(52) U.S. Cl. ...................... 438/202; 438/203; 438/234; 438/414
(58) Field of Search ................................ 438/202, 203, 438/234, 208, 414, 205, 207

(56) References Cited

U.S. PATENT DOCUMENTS

| | | |
|---|---|---|
| 5,374,586 A | 12/1994 | Huang et al. |
| 5,393,677 A | 2/1995 | Lien et al. |
| 5,506,158 A | 4/1996 | Eklund |
| 5,776,807 A | 7/1998 | Ronkainen et al. |

*Primary Examiner*—Charles Bowers
*Assistant Examiner*—Yennhu B. Huynh

(57) ABSTRACT

A bipolar complementary metal oxide semiconductor device has a c-well fabricated using profile engineering (a multi-energy implant using accurate dosages and energies determined by advance simulation) to provide a higher c-well implant dose while creating a narrow region with relatively low concentration in the collector depletion range to avoid low base-collector breakdown. This achieves a much lower collector series resistance to pull-up a frequency response, a collector sheet resistance which can be as low as 150 Ω/sq., and $f_T$ may be increased to 20 GHz or higher.

24 Claims, 11 Drawing Sheets

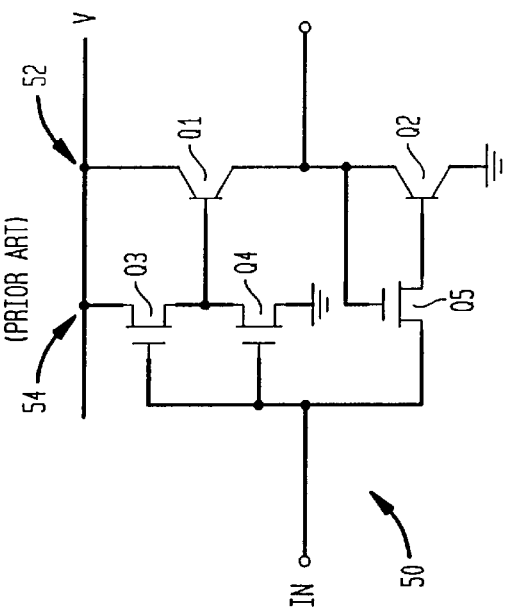
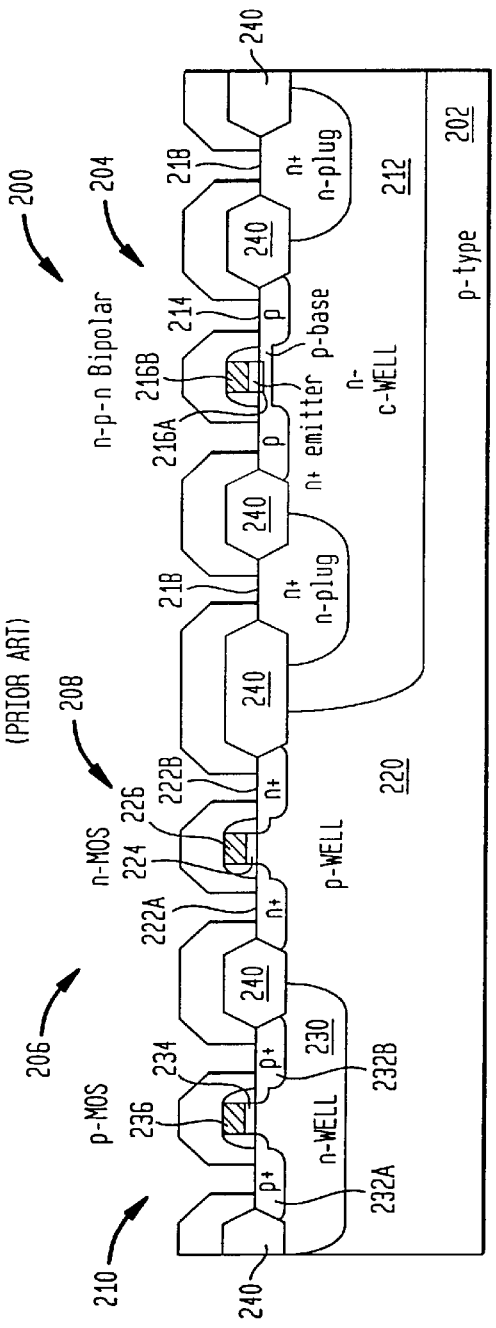
FIG. 1 (PRIOR ART)
FIG. 2 (PRIOR ART)

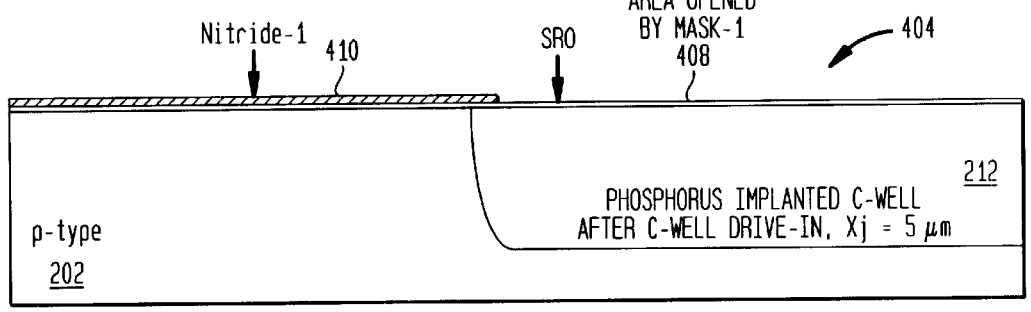
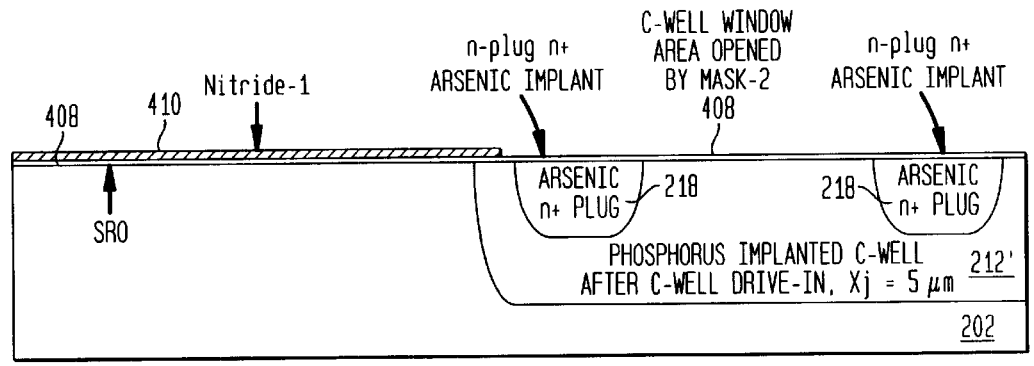
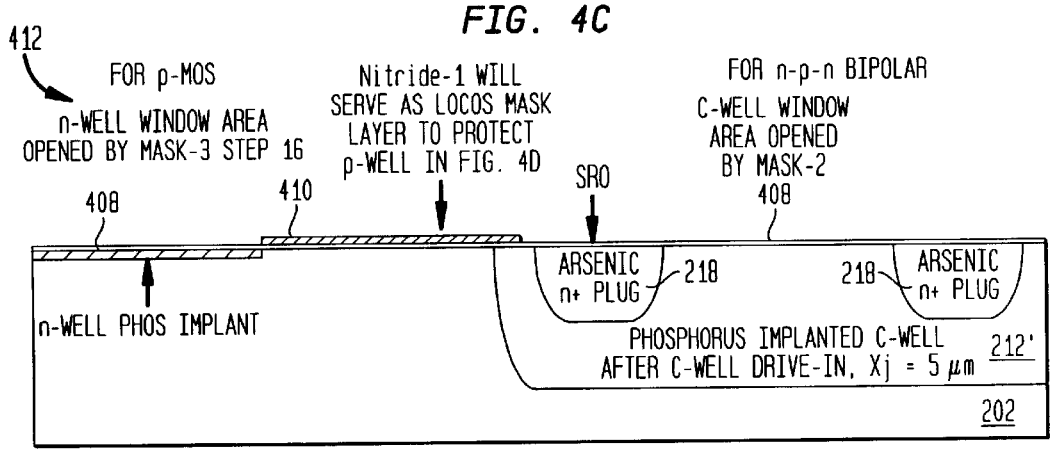

US 6,383,855 B1

HIGH SPEED, LOW COST BICMOS PROCESS USING PROFILE ENGINEERING

BACKGROUND OF THE INVENTION

1. Field of the Invention

The present invention relates to semiconductors and, more particularly, to an improved process for making complementary metal oxide semiconductor (CMOS) compatible bipolar CMOS (BiCMOS) devices.

2. Discussion of Related Art

A BiCMOS circuit includes both bipolar and complementary metal oxide semiconductor (CMOS) transistors in the same circuit. BiCMOS circuits enjoy advantages of both bipolar circuits and CMOS circuits. Bipolar circuits may drive high capacitive loads and thus provide large circuit fan outs and operate at high speed. CMOS circuits are relatively small in size and consume less power than other technologies. A typical BiCMOS device uses the bipolar circuits as a push-pull current booster and the CMOS circuits as logic circuits and to drive the base current of the bipolar circuits.

FIG. 1 is a schematic diagram of an example of a BiCMOS logic circuit 50 operating as an inverter. A totem pole-type output buffer 52 comprises a pull-up NPN bipolar transistor Q1 and a pull-down NPN bipolar transistor Q2. The base of transistor Q2 is coupled to an output terminal of a CMOS inverter 54 comprising a PMOS FET Q3 and an NMOS FET Q4. PMOS FET Q3 supplies a base current to bipolar transistor Q1 so that the logic circuit outputs a high voltage (data "1"). NMOS FET Q4 pulls a base charge from bipolar transistor Q1 so that the logic circuit outputs a low voltage (data "0"). The base of pull-down NPN bipolar transistor Q2 is connected to the source of NMOS FET Q5, which is turned on or off by the potential at the node of bipolar transistors Q1, Q2.

Many BiCMOS fabrication techniques are complicated and cannot be fabricated in standard CMOS foundries. This makes BiCMOS designs difficult to implement for integrated circuit designers that rely on standard CMOS foundries.

FIG. 2 is a cross-sectional view of a triple well polysilicon emitter BiCMOS device 200, which may be fabricated in a standard CMOS foundry. This device includes a p-type substrate 202 on which an NPN bipolar transistor 204 and CMOS device 206 are formed. The CMOS device comprises an NMOS device 208 and a PMOS device 210. The NPN transistor 204 includes a collector defined in an n-type c-well 212, a p-type base region 214, and an n+ emitter 216 formed by doped polysilicon. The NPN transistor 204 also includes an n+ n-plug collector ring 218 which contacts the collector 212 and reduces series resistance.

The NMOS device 208 is formed in a p-well 220 defined in the p-type substrate 202 and includes n+ drain and source regions 222A, 222B, and a gate oxide layer 224 on which a doped polysilicon p-type gate 226 is formed.

The PMOS device 210 is formed in an n-well 230 and includes p+ drain and source regions 232A, 232B, and a gate oxide layer 234 on which a doped polysilicon n-type gate 236 is formed. A number of field oxide regions 240 are defined on the surface as isolation areas between devices.

A prior art method for manufacturing this BiCMOS device 200 is illustrated with reference to FIGS. 3A–3H. FIG. 3A shows a p-type substrate 202. The substrate may be a conventional p-type wafer having a resistivity of about 6 to 9 $\Omega cm^{-2}$. A 310 nm thick sacrificial oxide layer 302 is formed on the substrate to provide a protective layer for formation of the n-plug.

The sacrificial oxide layer 302 is etched from the areas where the n-plug ring collector 218 is to be formed. A second etch, removing 120 nm silicon for the c-well lithography alignment, is also performed. The photoresist layer is stripped and the wafer is cleaned. The wafer is exposed to an oxidation step to grow a 20 nm thick screen oxide for the following implant steps. The n-plug ring is formed by an implant of arsenic at an energy of 150 keV and a dose of $1\times10^{15}$ $cm^{-3}$. The result of these steps is illustrated in FIG. 3B.

Next, all of the oxide is stripped off of the wafer. A 30 nm stress release oxide (SRO) layer 304 is grown and then a 150 nm nitride layer 306 is deposited on the SRO layer by using low pressure chemical vapor deposition (LPCVD). These two layers are masked and the SRO and nitride layers 304, 306 are etched to create windows for forming the c-well 212. (These layers are also etched to create a window for the n-well 230 in the following step with the n-well mask.) When the windows are provided, the c-well implant is performed using a conventional implant of phosphorus at an energy of 150 keV with a maximum dose of $3\times10^{13}$ $cm^{-3}$. After the c-well and n-well implant, an n-well/c-well oxidation step is carried out at 1050° C. to grow an oxide layer 307 of 4000 Å. The result of these steps is shown in FIG. 3D.

Conventional CMOS steps follow: the nitride layer over the p-well is etched off and the p-well implant is carried out as the 3800 Å n-well/c-well oxide protects the n-well/c-well from the implant. The oxide layer 307 is then removed. A CMOS p-well drive-in step is carried out at 1150° for 8 hours.

As seen in FIG. 3E, a number of field oxide regions (FOX) 240 are formed on the substrate 202. These FOX regions 240 may be formed in any well-known manner.

A gate oxide 234 is grown on the substrate surface in a conventional manner. Then, the gate oxide is etched off over the base area 214 to form a base window with a base mask. The result of these steps is shown in FIG. 3F.

Next, a base implant is performed using a p-type impurity such as $BF_2$ at an energy of 80 keV and a typical dose of $2\times10^{13}$ $cm^{-3}$. This forms the p-type base 214. The wafer is cleaned and approximately 20 Å of oxide is removed using a precise oxide HF in 50:1 HF for 10 sec to remove oxide from the base area before polysilicon deposition. The result of these steps is shown in FIG. 3G.

Next, polysilicon deposition is performed. The NMOS and PMOS polysilicon gate structures 226, 236 are located on the gate oxide; a polysilicon emitter 217 is located on the substrate surface, in contact with the p-type base 214. The polysilicon emitter 217 is doped with an extremely high arsenic implant. The dose is as high as $1\times10^{16}$ $cm^{-3}$ at an energy of 50 keV, which is four times higher than a conventional CMOS polysilicon implant. This high dose eliminates the two dimensional effect for the narrow emitter and provides high emitter concentration for high emitter injection. A shallow emitter drive-in step is performed. This drive-in results in a very shallow n+ layer 216 in the base area 214.

The next step is the polysilicon patterning with over-etch to remove polysilicon stringers along steps as well as etching away the n+ layer 216 in the extrinsic base region formed during the emitter drive-in step. A normal CMOS over-etch process is used because of the gate oxide beneath the polysilicon to protect the source and drain regions. But in this case, the bipolar base part 214 is directly exposed to etching without oxide protection, so that a certain amount of silicon in the extrinsic base area is etched away. The result of these steps is shown in FIG. 3H.

Conventional CMOS steps follow including n-LDD, p-LDD, spacer formation, NMOS source and drain implant, and PMOS source and drain implant.

As noted above, this BiCMOS device may be fabricated in many CMOS foundries without substantially changing the CMOS components. The c-well has a uniform profile. That is, the c-well has a dopant concentration which is highest near the substrate surface and which decreases as it deepens from the surface. The c-well is doped in this manner to improve frequency-current response by lowering the c-well sheet resistance ($R_{sc}$). However, lowering $R_{sc}$ degrades the $BV_{ceo}$ i.e., collector-emitter breakdown voltage breakdown. Thus, in this device, the optimum $R_{sc}$ which may be achieved is 300 Ω/sq and, as a tradeoff, a 4V $BV_{ceo}$ and a maximum $f_T$ (cut off frequency) of 15 GHz. This is because a lower $R_{sc}$ results in a higher $f_T$.

It is an object of the present invention to provide a CMOS compatible BiCMOS fabrication technique which increases $f_T$ and maintains an acceptable $BV_{ceo}$.

SUMMARY OF THE INVENTION

This and other objects of the present invention are provided by a BiCMOS device having a c-well fabricated using profile engineering (a multi-energy implant using accurate dosages and energies determined by simulation) to provide a higher c-well implant dose while creating a narrow region with relatively low concentration in the collector depletion range to avoid low base-collector breakdown. This achieves a much lower collector series resistance to pull-up a frequency response, a collector sheet resistance which can be as low as 150 Ω/sq., $f_T$ may be increased to 20 GHz or higher, and epitaxial wafers are avoided. This latter advantage is desirable because epitaxial wafers are incompatible with CMOS processes performed by most foundries.

The c-well may be formed using profile engineering so that the carrier concentration near the base-collector junction in the collector region is made lower than the dopant concentration in the deep region of the c-well. For example, the base-collector junction may be formed with a depth of 0.25 μm and have a regional (engineered) c-well carrier concentration less than $10^{17}$ cm$^{-3}$; and the c-well may have a doping concentration higher than $10^{17}$ cm$^{-3}$ at depths deeper than 0.6 μm.

Also, a method according to a preferred embodiment of the present invention eliminates a silicon etch step during the collector ring formation procedures to provide a more efficient method for creating a BiCMOS device than previously possible.

BRIEF DESCRIPTION OF THE DRAWINGS

The present invention is described with reference to the following figures:

FIG. 1 is a schematic diagram of an example of a BiCMOS device logic circuit unit used as an inverter;

FIG. 2 is a cross sectional view of a prior art BiCMOS device;

FIGS. 4A–4H illustrate a method for fabricating a BiCMOS device according to the present invention;

DETAILED DESCRIPTION OF A PREFERRED EMBODIMENT

To increase $F_T$ while keeping $VC_{ceo}$ at an acceptable level, the present invention provides a novel technology of precise profile engineering of the c-well. By using profile engineering in the c-well, a much higher c-well implant dose may be achieved, which provides a lower collector series resistance to pull up the frequency response. The profile engineering maintains a narrow region having a relatively low concentration in the collector depletion range which may be at a depth of, for example, from 0.2 μm to 0.5 μm, to avoid low base-collector breakdown. This allows the collector sheet resistance to be lowered down as low as 150 Ω/sq. The resultant BiCMOS structure looks similar to the structure shown in FIG. 2, with the most significant difference being that the c-well concentrations are different, as described below. The present invention also eliminates a silicon etch step during the n-plug formation, and thus improves the morphology of the device.

Figure 3A:
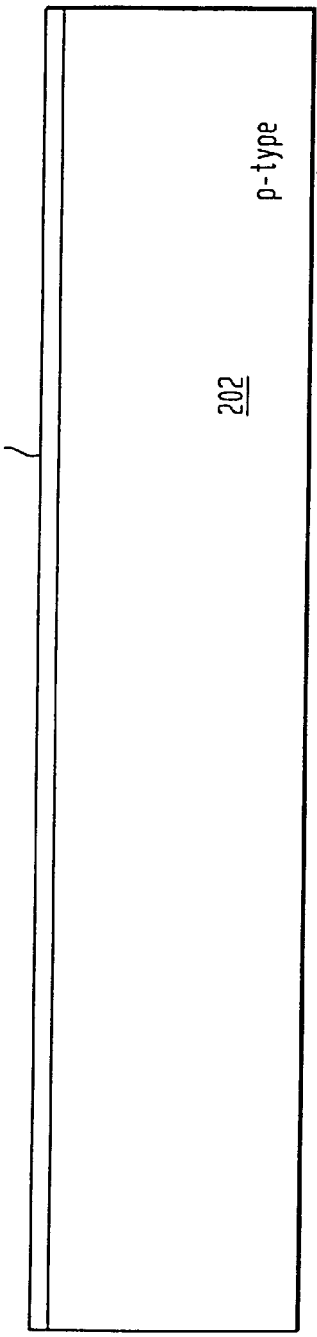
FIGS. 3A–3H illustrate a conventional method for fabricating the BiCMOS device of FIG. 2.
Figure 3B:
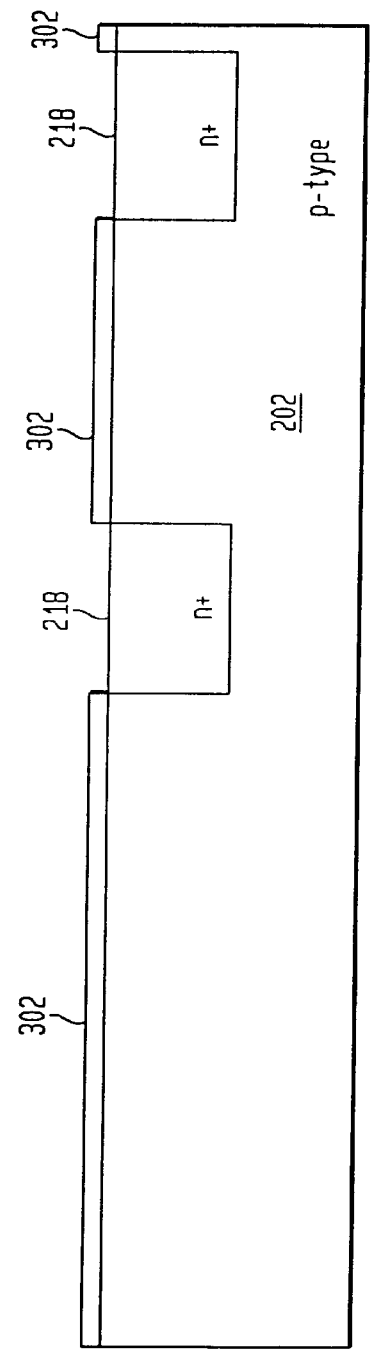
Figure 3C:
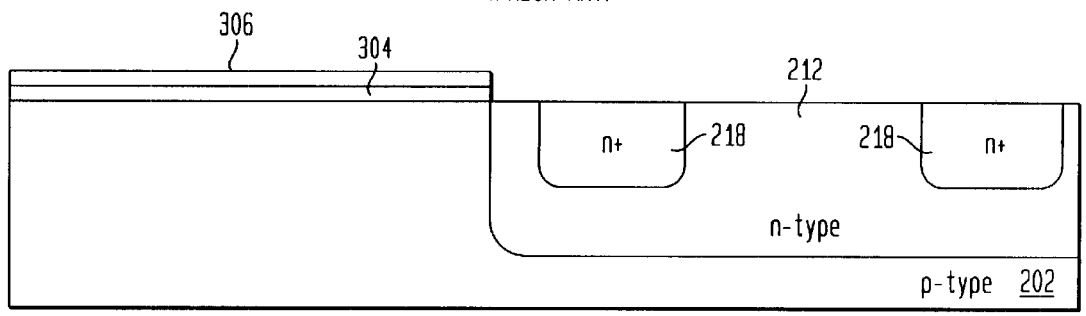
Figure 3D:
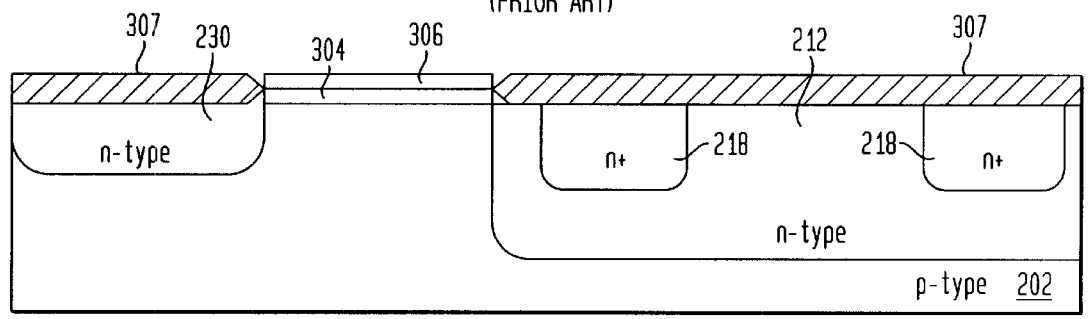
Figure 3E:
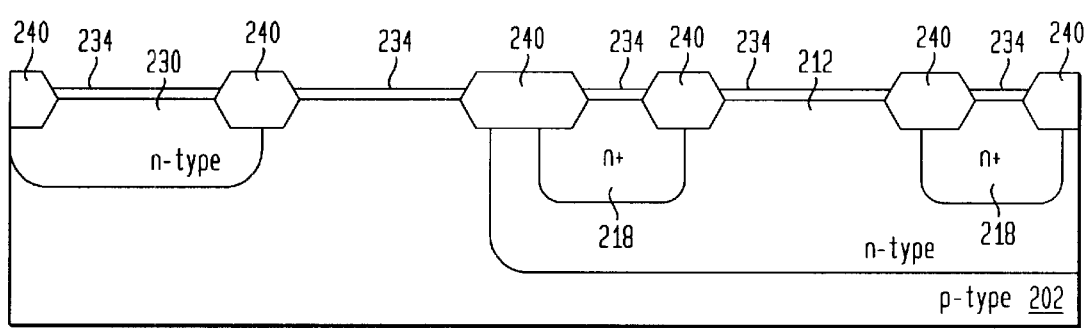
Figure 3F:
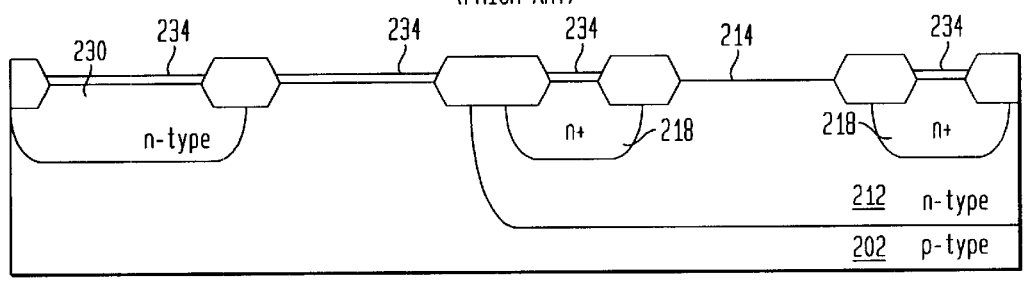
Figure 3G:
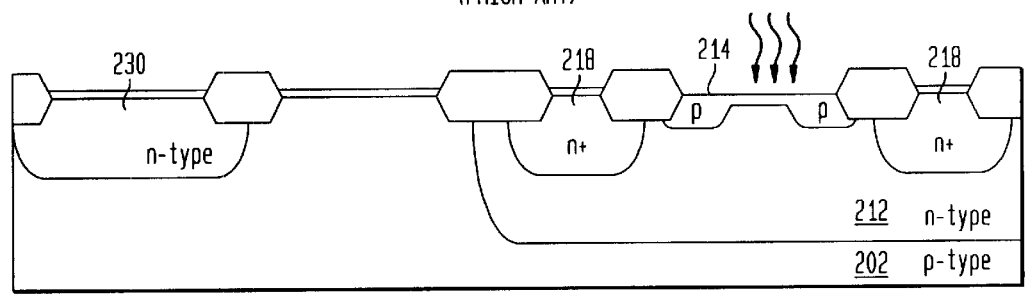
Figure 3H:
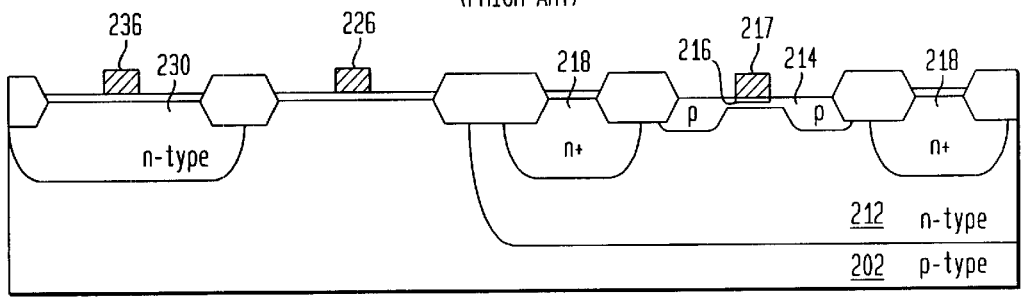
Figure 4D:
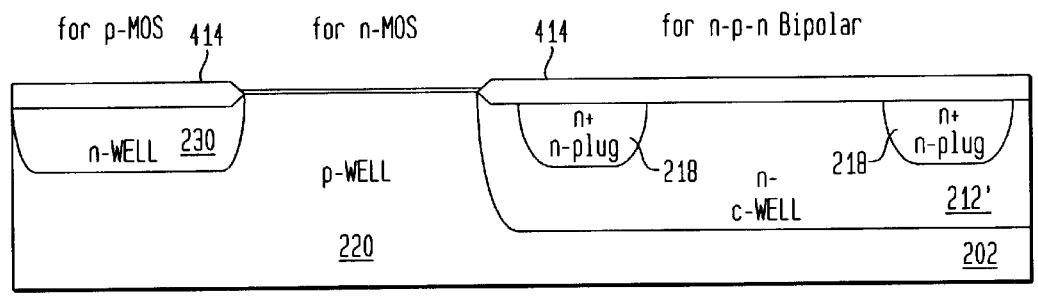

A method for fabricating a BiCMOS device according to the present invention is described with reference to FIGS. 4A–4H. FIG. 4A shows a p-type substrate 202. The substrate is preferably a conventional p-type wafer having a resistivity of about 6 to 9 Ω/cm$^{-2}$. A stress release oxide (SRO) 408 is grown on the substrate 202. Preferably, the SRO 408 is 30 nm thick. Next, a nitride layer 410 is deposited on the SRO. Preferably, the nitride layer 410 is 150 nm thick and deposited using LPCVD. Using photolithographic methods, photoresist is placed on the nitride layer 410 to define a c-well window 404. The nitride layer 410 is etched off, keeping the SRO 408 as a screen for a phosphorous implant described below. The photoresist is kept on. Next, a c-well implantation is performed using, for example, phosphorus at an energy of 150 keV and a dose of between 3–5×10$^{13}$ cm$^{-3}$, to form a c-well 212'. The photoresist is removed and the wafer is cleaned. The result of these steps is seen in FIG. 4A.

As seen in FIG. 4B, using photolithographic methods, a second mask is used to define an n-plug (collector ring) 218. When the n-plug windows are opened, the exposed windows are doped with an n+ impurity such as arsenic, preferably at an energy of 150 keV and a dose of about 1×10$^{15}$ cm$^{-3}$. This n-well doping step results in a reduced collector contact series resistance. The mask is then removed. After the n-plug implant, a c-well drive in step is carried out, preferably at 1150° C. for 8 hours or 1175° C. for 200 minutes. The result of these steps is seen in FIG. 4B.

As seen in FIG. 4C, using photolithographic techniques, a third mask is used to define an n-well 412 window. The nitride layer 410 is removed for the n-well implant and LOCOS steps. The nitride layer 410 is preferably removed using a plasma etch. The n-well is created, for example, using an n-type impurity such as phosphorous. Preferably, this is done at an energy of 150 keV and a dose of 8×10$^{12}$ cm$^{-3}$. The result of these steps is seen in FIG. 4C.

Next, the n-well/c-well LOCOS oxidation is performed to form a sacrificial LOCOS oxidation layer 414. This layer preferably has a thickness of 380 nm. Next, the remainder of the nitride layer 410 is removed, preferably using H$_3$PO$_4$ at 170° C. for 60 minutes. Next, the p-well implant is performed by implanting a p-type impurity, such as implanting boron at an energy of 50 keV and a dose of 4×10$^{12}$ cm$^{-3}$.

Next, a drive-in step is performed at 1150° C. This drive-in step finalizes the formation of the p-well 220 and the n-well 230. The result of these steps is seen in FIG. 4D.

Figure 4E:
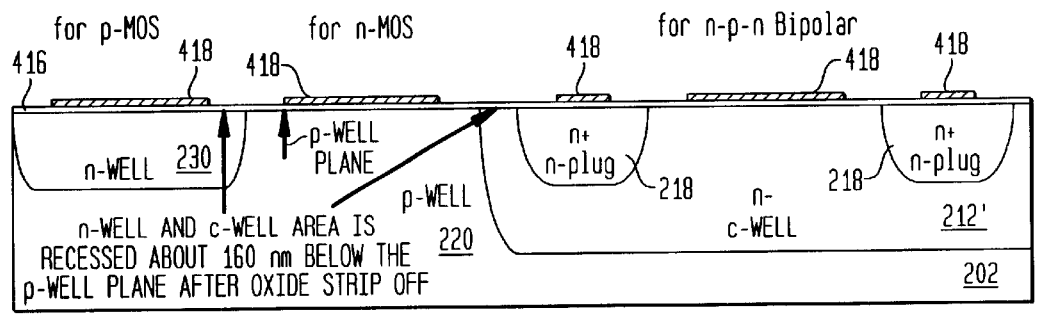

Next, all the oxide is stripped to bare wafer in BOE and ready for the second nitride deposition. Note that after this step, the n-well and c-well areas 220, 212' are recessed about 160 nm below the p-well 220 plane. For simplicity, however, this is not shown in the figures. A second stress reduction oxide layer 416 is grown, preferably using dry oxidation at 900° C. to create a 30 nm layer. A second nitride layer 418 is deposited using, for example, LPCVD to create a 150 nm layer. This second nitride layer 418 is etched to expose field oxide regions. The result of these steps is seen in FIG. 4E.

Figure 4F:
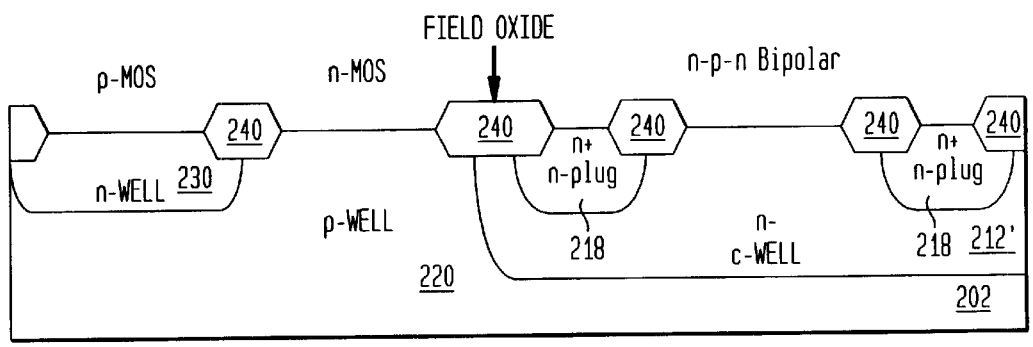

Next, a number of field oxide regions (FOX) 240 are formed on the substrate 202. These FOX regions may be formed in any well-known manner. The result of this step is seen in FIG. 4F.

Next a LOCOS field wet oxidation is performed. A nitride layer 418 is removed using, for example, $H_3PO_4$ at 170° for 60 minutes followed by an SRO HF dip off. The result of these steps is seen in FIG. 4F.

Next, optionally a $V_t$ adjustment implant is performed to adjust the well doping to the desired $V_t$ value. Next, a pre-gate oxide etch may be performed to clear active areas for gate oxidation.

Next, a gate oxide layer 430 is grown on the substrate surface in a conventional manner. Preferably, the gate oxide 430 has a thickness of 175 Å+Δ, where Δ is an amount introduced to compensate for a HF dip thickness loss, discussed below. The gate oxide in the base active area is etched off over the c-well 212' area by lithography to form a window 432. This window is used to perform the collector profile engineering implants. The profile engineering uses one or more implants of a p-type dopant, such as boron, having predetermined dosages and energy levels precisely to control the total dopant concentration of the c-well 212'. Preferably, these implants are as follows:

| Dopant | Energy | Dosage |
|---|---|---|
| Boron | 65 keV | $2.1 \times 10^{12}$ cm$^{-3}$ |
| Boron | 120 keV | $2.2 \times 10^{12}$ cm$^{-3}$ |

These precisely engineered boron implants partially compensate the n-type phosphorous doping previously performed in the specified region.

Figure 4G:
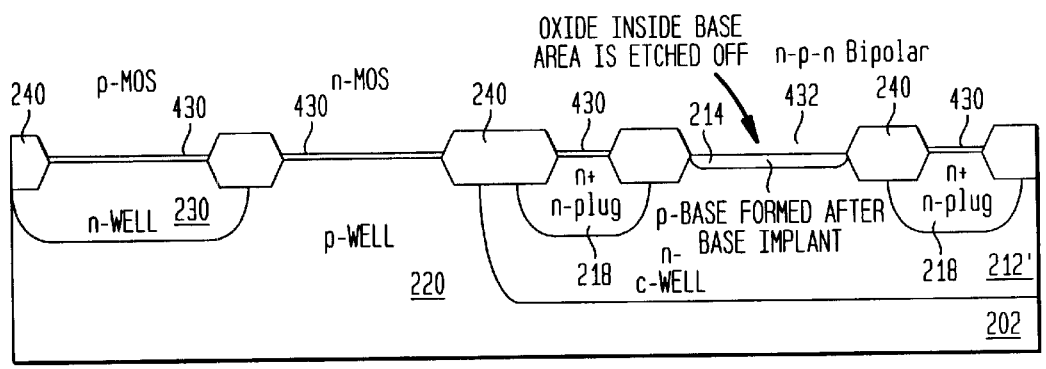

The gate oxide over the base active area is etched away. The base is then doped to a p-type conductivity using, for example, boron at an energy of 20 keV and a dose of $2 \times 10^{13}$ and 7°. This type of implant reduces channeling of implanted ions. This forms p-type base 214. The result of these steps is seen in FIG. 4G.

Next, an HF dip is performed to remove native oxide formed in base areas during photoresist stripping. This HF dip results in a small oxide loss Δ in the gate oxide 430. This thickness loss is Δ described above, which should be well controlled.

Figure 4H:
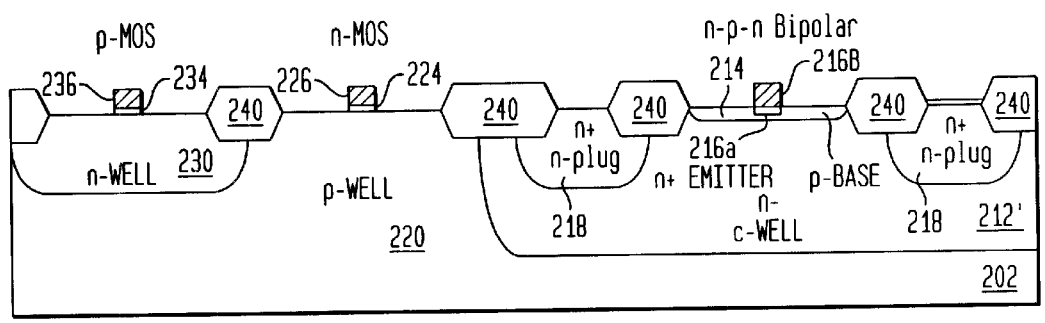

Next, polysilicon deposition is performed. The NMOS and PMOS polysilicon gate structures 226, 236 are located on the gate oxide (224, 234, respectively); a polysilicon emitter 216 is located on the substrate surface, in contact with the p+ base 214. Preferably, the polysilicon layer is 280 nm. The polysilicon emitter 216 is doped with an extremely high arsenic implant. The dose is as high as $2 \times 10^{16}$ cm$^{-3}$ at an energy of 50 keV. The implant is annealed and a shallow emitter drive-in step is performed. This drive-in also results in a thin n+ layer 216A in the extrinsic base area which will be etched away by a precise over-etch of the polysilicon. The result of these steps is seen in FIG. 4H. The same steps may also form a top capacitor plate for the PMOS device capacitor.

Conventional CMOS steps follow to complete the fabrication of the inventive BiCMOS device. These conventional steps include n-LDD, p-LDD, spacer formation, NMOS source and drain implants, and PMOS source and drain implants. These steps are well known to those skilled in the art and are not further described.

Figure 5:
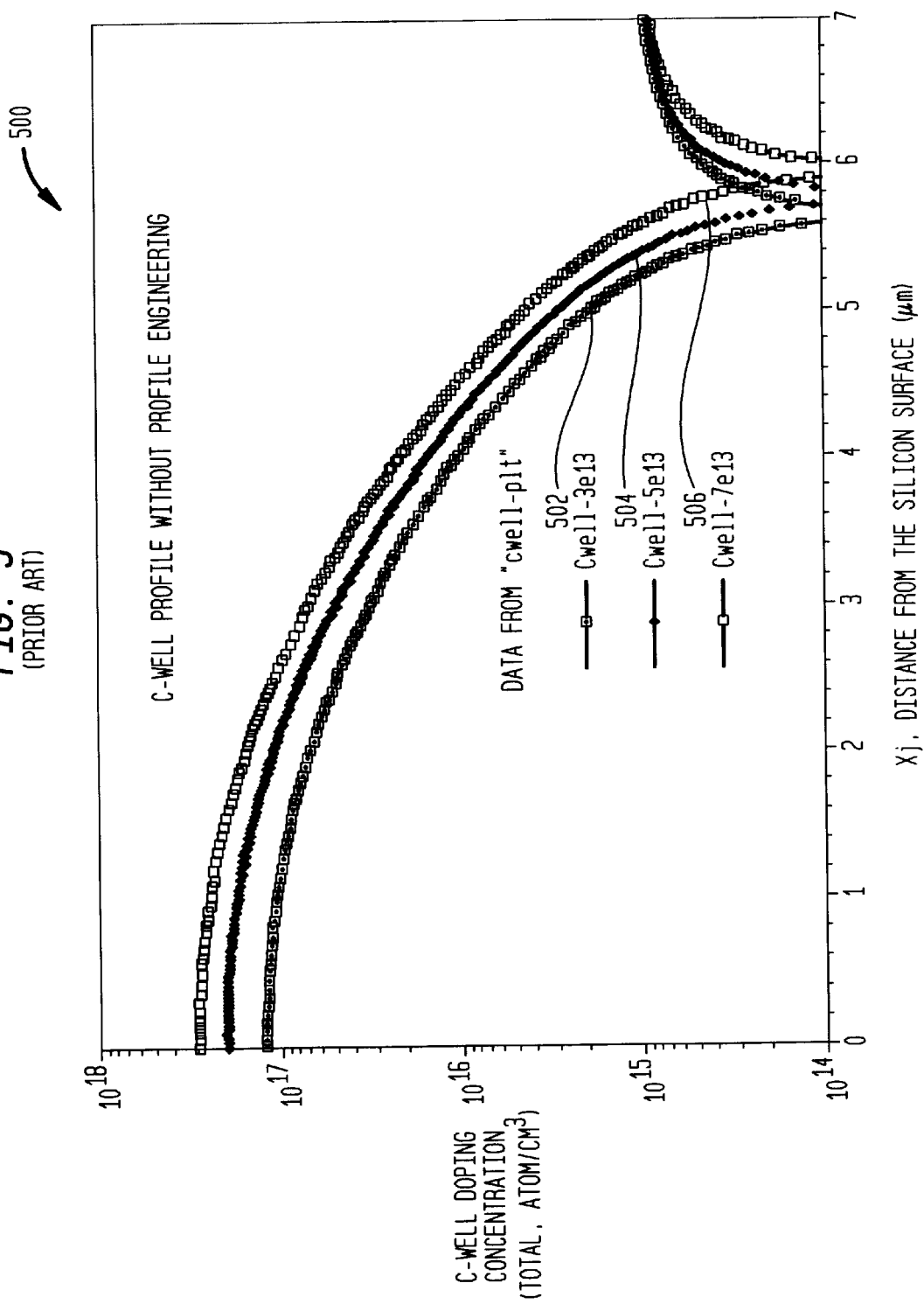
FIG. 5 is a graph illustrating dopant concentration vs. distance from substrate surface in a prior-art c-well using three different dopant doses.

FIG. 5 is a graph 500 of a simulated profile of three c-well implants without using profile engineering, such as in the prior art device described below. The dosages are $3 \times 10^{13}$ (line 502), $5 \times 10^{13}$ (line 504), and $7 \times 10^{13}$ (line 506), respectively. (Note that these last two dosages cannot be applied without proper profile engineering, but for purposes of this simulation, it is assumed that they can be.) Note that in all three incidences, between 0 and 1 µm from the substrate surface, the doping concentration is between $1 \times 10^{17}$ and $5 \times 10^{17}$. Thus, a very high dopant concentration in the c-well 212 occurs near the substrate surface.

Figure 6:
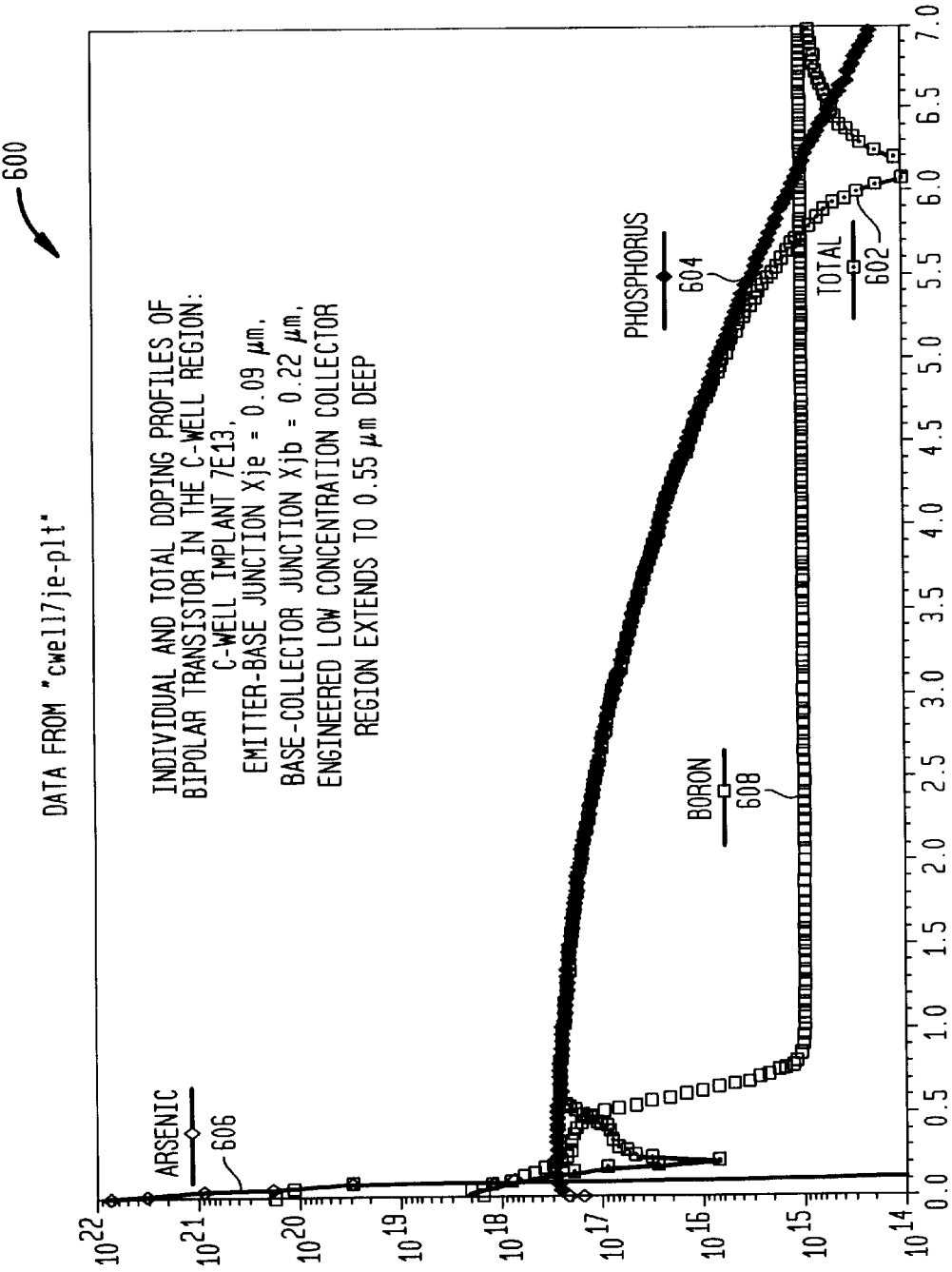
FIG. 6 is a graph illustrating dopant concentration vs. distance from substrate surface in a c-well according to the present invention.
Figure 7:
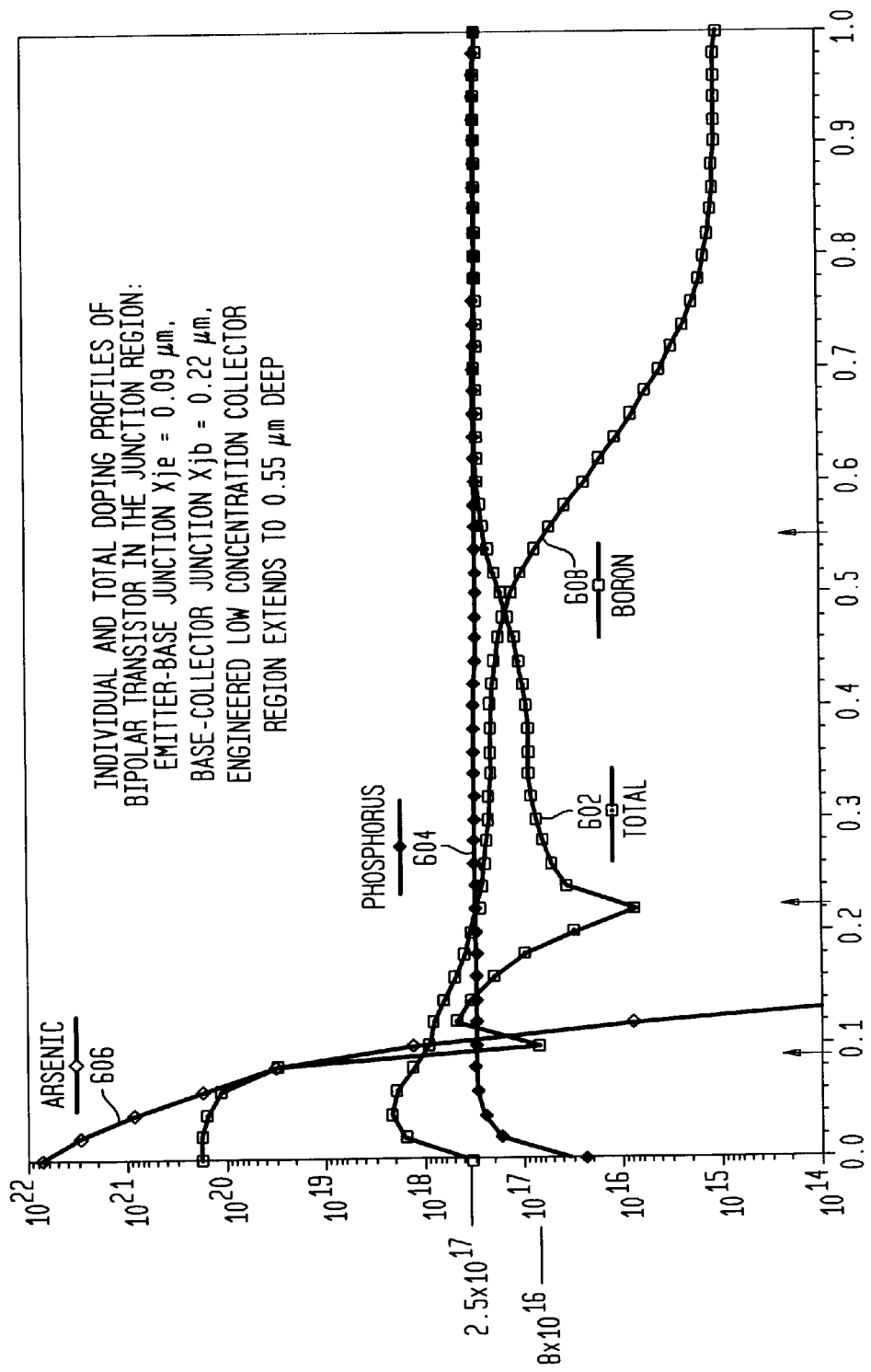
FIG. 7 is a graph showing the concentrations of FIG. 6 for the depths between 0.0 and 1.0 μm from substrate surface.

FIGS. 6 and 7 illustrate the advantage of profile engineering in the present invention. FIG. 6 is a graph 600 illustrating the simulated c-well profile of a c-well 212' using profile engineering according to the present invention. FIG. 7 is a graph 700 showing the same concentration for depths between 0 and 1 µm from the substrate surface. These graphs show the concentration of arsenic 606 (from the emitter 216A), phosphorus 604 (from the c-well 212'), boron 608 (the base), and total effective dopant concentration 602 as a function of the distance from a surface of the substrate. Note that the emitter-base junction $X_{JB}$, preferably occurs at 0.09 µm from the substrate surface and has a concentration of about $2 \times 10^{20}$ cm-3. The base-collector junction $X_{JB}$, preferably occurs at approximately 0.22 µm collector total and has a concentration less than $10^{17}$ cm$^{-3}$ near the base-emitter junction. The engineered low concentration collector region preferably extends from 0.22 µm to approximately 0.55 µm. This region is important to collector-emitter breakdown after profile engineering. The total average concentration is about $8 \times 10^{16}$, which is much lower than the original level of $2.5 \times 10^{17}$. This lower concentration region allows for a much thicker depletion layer for higher breakdown. On the other hand, this low concentration region is very limited around the base-collector junction and has a thickness of only about 5% of the collector well. The high concentration of the collector well can increase $f_T$. At depths below 0.6 µm, the effective total dopant concentration may be as high as $2.5 \times 10^{17}$ cm$^{-3}$. It is this precise profile engineering which permits a high total concentration in the c-well, yet a low concentration near the substrate surface.

Figure 8:
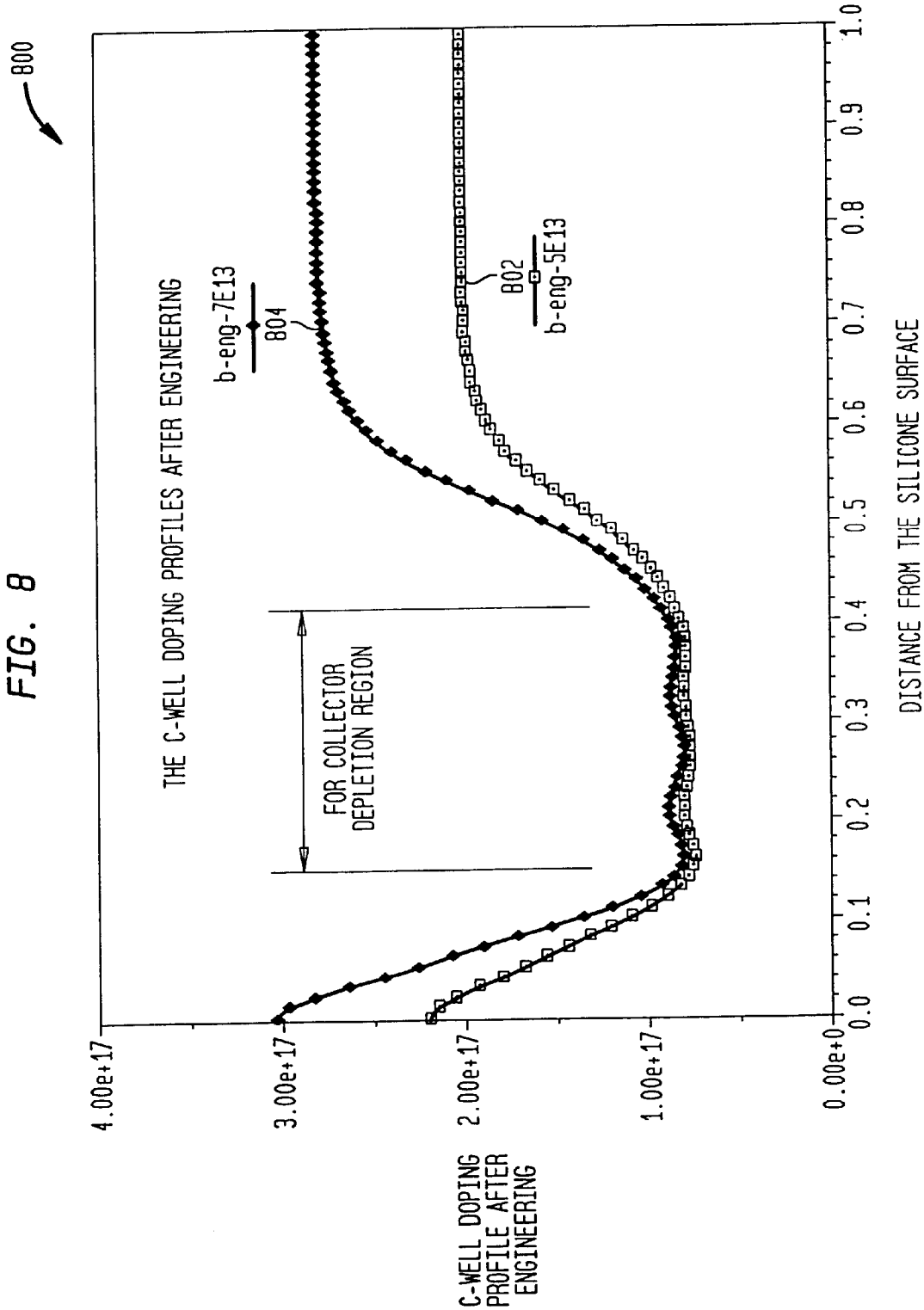
FIG. 8 is a linear scale of the graph of FIG. 7.

FIG. 8 is a graph 800 showing the data of FIG. 7 plotted on a linear scale for a dosage of $7 \times 10^{13}$ (line 804) and a dosage of $5 \times 10^{13}$ (line 802). Note the low total concentration in the collector depletion region from approximately 0.1 µm to 0.4 µm from the substrate surface.

Using profile engineering in the manner described above permits the c-well to be formed so that the dopant concentration in the emitter-base junction, base-collector junction, and collector region which is lower than a dopant concentration in other regions of the c-well. The base-collector junction may be formed at about 0.25 µm and have a dopant concentration less than $10^{17}$ cm$^{-3}$; and the c-well may have a dopant concentration greater than $2.5 \times 10^{17}$ cm$^{-3}$ at depths deeper than 0.6 µm.

Disclosed is a BiCMOS device which provides a low collector series resistance without compromising the base-collector breakdown. This is achieved by using profile engineering to create a low carrier concentration at the base-collector junction, and collector region; yet providing a c-well having a very high overall concentration, thus lower $R_{SC}$. This achieves a much lower collector series resistance to pull-up a frequency response, a collector sheet resistance which can be as low as 150 Ω/sq., and $f_T$ may be increased to 20 GHz or higher.

The above described embodiments of the invention are intended to be illustrative only. Numerous alternative embodiments may be devised by those skilled in the art without departing from the spirit and scope of the following claims.

We claim:

1. A method for fabricating a bipolar complementary metal oxide semiconductor, the method comprising the steps of:
    a. forming on a surface of a substrate having a first conductivity type a complementary metal oxide semiconductor device, comprising an n-type metal oxide semiconductor device formed in a p-type well and a p-type metal oxide semiconductor device formed in an n-type well;
    b. forming a bipolar transistor in a c-well having a second conductivity type opposite the first conductivity type; and
    c. forming the c-well using profile engineering so that dopant concentrations at a base-collector junction of the c-well and in a collector region of the c-well are lower than dopant concentrations in other regions of the c-well farther from the surface of the substrate.

2. The method of claim 1, wherein the step of forming the bipolar transistor further comprises the steps of:
    forming the base-collector junction at a depth of about 0.25 μm the surface of the substrate,
    forming the collector region to extend to a depth of about 0.55 μm from the surface of the substrate, and
    forming the dopant concentration at depths greater than 0.6 μm to be greater than the dopant concentrations at the base-collector junction and in the collector region.

3. The method of claim 1, wherein the step of forming the bipolar transistor further comprises the steps of:
    forming the base-collector junction at a depth of about 0.25 μm from the surface of the substrate having a dopant concentration less than $10^{17}$ cm$^{-3}$ near the base-collector junction; and
    the c-well having a dopant concentration greater than $10^{17}$ cm$^{-3}$ at depths greater than 0.6 μm.

4. The method of claim 3, wherein the step of forming the bipolar transistor further comprises the step of:
    forming a base-emitter junction having a dopant concentration of about $2 \times 10^{20}$ cm$^{-3}$.

5. The method of claim 1, wherein the step of forming the c-well further comprises the steps of:
    forming in the substrate a c-well area by implanting first impurities having the second conductivity type;
    forming in the substrate a collector ring by implanting second impurities having the second conductivity type; and
    performing the profile engineering on the c-well by implanting third impurities having the first conductivity type using one or more predetermined dosages and energy levels.

6. The method of claim 5, wherein the step of performing the profile engineering further comprises performing:
    a first boron implant at an energy of 65 keV and a dosage of $2.1 \times 10^{12}$ cm$^{-3}$; and
    a second boron implant at an energy of 120 keV and a dosage of $2.2 \times 10^{12}$ cm$^{-3}$.

7. The method of claim 5, further comprising selecting the first impurities to be phosphorous atoms, selecting the second impurities to be arsenic atoms, and selecting the third impurities to be boron atoms.

8. The method of claim 1, wherein the step of forming the c-well further comprises the step of:
    doping the c-well so that the dopant concentrations in said other regions of the c-well are such that a cut-off frequency $f_T$ is 20 GHz or higher.

9. A method for fabricating a bipolar complementary metal oxide semiconductor on a substrate having a first conductivity type, the method comprising the steps of:
    a. growing an oxide layer on a surface of the substrate;
    b. depositing on the oxide layer a nitride layer;
    c. removing a first selected portion of the nitride layer to expose a c-well window;
    d. doping the c-well window with first impurities having a second conductivity type to form a c-well;
    e. exposing a second selected portion of the substrate within the c-well to expose an n-plug collector ring window;
    f. doping the second selected portion with second impurities having the second conductivity type to form an n-plug collector ring;
    g. forming complementary oxide semiconductor devices on the substrate;
    h. growing a gate oxide on active areas of the substrate surface;
    i. exposing a third selected portion of the gate oxide to expose at least part of the c-well;
    j. using profile engineering, doping the c-well with third impurities having the first conductivity type, so that dopant concentrations at a base-collector junction in the c-well and in a collector region in the c-well are lower than dopant concentrations in other regions of the c-well farther from the surface of the substrate;
    k. forming above the c-well a base region having the first conductivity type; and
    l. depositing polysilicon above the base region and doping the polysilicon with impurities having the second conductivity type to form an emitter.

10. The method of claim 9, wherein the step of doping the c-well using profile engineering further comprises the steps of:
    forming the base-collector junction at a depth of about 0.25 μm from the surface of the substrate,
    forming the collector region to extend to a depth of about 0.55 μm from the surface of the substrate, and
    forming the dopant concentration at depths greater than 0.6 μm to be greater than the dopant concentrations at the base-collector junction and in the collector region.

11. The method of claim 9, wherein the step of doping the c-well using profile engineering further comprises the steps of:
    forming the base-collector junction at a depth of about 0.25 μm from the surface of the substrate having a dopant concentration less than $10^{17}$ cm$^{-3}$ near the base-collector junction; and the c-well having a dopant concentration greater than $10^{17}$ cm$^{-3}$ at depths greater than 0.6 μm.

12. The method of claim 11, wherein the step of doping the c-well using profile engineering further comprises the step of:

forming a base-emitter junction having a dopant concentration of about $2\times10^{20}$ cm$^{-3}$.

13. The method of claim 9, further comprising selecting the first impurities to be phosphorous atoms, selecting the second impurities to be arsenic atoms, and selecting the third impurities to be boron atoms.

14. The method of claim 9, wherein the step of doping the c-well using profile engineering further comprises the step of:

performing the profile engineering on the c-well by implanting third impurities having the first conductivity type using one or more predetermined dosages and energy levels.

15. The method of claim 14, wherein the step of performing the profile engineering further comprises:

performing a first boron implant at an energy of 65 keV and a dosage of $2.1\times10^{12}$ cm$^{-3}$; and performing a second boron implant at an energy of 120 keV and a dosage of $2.2\times10^{12}$ cm$^{-3}$.

16. The method of claim 9, wherein the step of doping the c-well using profile engineering further comprises the step of:

doping the c-well so that the dopant concentrations in said other regions of the c-well are such that a cut-off frequency $f_T$ is 20 GHz or higher.

17. A method of forming a c-well in a substrate, the method comprising the steps of:

a. designating at least a portion of the substrate for the c-well;

b. doping a surface of said at least a portion of the substrate with first impurities of a first conductivity type;

c. doping at least a first part of the surface with second impurities of the first conductivity type;

d. doping at least a second part of the surface with third impurities of a second conductivity type, wherein the doping with the third impurities is performed using profile engineering so that dopant concentrations at a base-collector junction in the c-well and in a collector region in the c-well are lower than dopant concentrations in other regions of the c-well farther from the surface of the substrate.

18. The method of claim 17, wherein the step of doping with the third impurities further comprises the steps of:

forming the base-collector junction at a depth of about 0.25 μm from the surface of the substrate, forming the collector region to extend to a depth of about 0.55 μm from the surface of the substrate, and forming the dopant concentration at depths greater than 0.6 μm to be greater than the dopant concentrations at the base-collector junction and in the collector region.

19. The method of claim 17, wherein the step of doping with the third impurities further comprises the steps of:

forming the base-collector junction at a depth of about 0.25 μm from the surface of the substrate having a dopant concentration less than $10^{17}$ cm$^{-3}$ near the base-collector junction; and the c-well having a dopant concentration greater than $10^{17}$ cm$^{-3}$ at depths greater than 0.6 μm.

20. The method of claim 19, wherein the step of doping with the third impurities further comprises the step of:

forming a base-emitter junction having a dopant concentration of about $2\times10^{20}$ cm$^{-3}$.

21. The method of claim 17, further comprising selecting the first impurities to be phosphorous atoms, selecting the second impurities to be arsenic atoms, and selecting the third impurities to be boron atoms.

22. The method of claim 17, wherein the step of doping with the third impurities further comprises the step of:

performing the profile engineering on the c-well by implanting third impurities having the first conductivity type using one or more predetermined dosages and energy levels.

23. The method of claim 22, wherein the step of performing the profile engineering further comprises:

performing a first boron implant at an energy of 65 keV and a dosage of $2.1\times10^{12}$ cm$^{-3}$; and performing a second boron implant at an energy of 120 keV and a dosage of $2.2\times10^{12}$ cm$^{-3}$.

24. The method of claim 17, wherein the step of doping with the third impurities further comprises the step of:

doping the c-well so that the dopant concentrations in said other regions of the c-well are such that a cut-off frequency $f_T$ is 20 GHz or higher.

\* \* \* \* \*